United States Patent
Ye et al.

(10) Patent No.: US 11,496,120 B2
(45) Date of Patent: Nov. 8, 2022

(54) FLIP-FLOP CIRCUIT WITH GLITCH PROTECTION

(71) Applicant: Apple Inc., Cupertino, CA (US)

(72) Inventors: Qi Ye, Cupertino, CA (US); Ajay Bhatia, Saratoga, CA (US); Vivekanandan Venugopal, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/150,888

(22) Filed: Jan. 15, 2021

(65) Prior Publication Data
US 2022/0231673 A1    Jul. 21, 2022

(51) Int. Cl.
| H03K 3/037 | (2006.01) |
| H03K 3/3562 | (2006.01) |
| H03K 3/356 | (2006.01) |
| H03K 3/012 | (2006.01) |

(52) U.S. Cl.
CPC .......... *H03K 3/0375* (2013.01); *H03K 3/012* (2013.01); *H03K 3/35625* (2013.01); *H03K 3/356034* (2013.01)

(58) Field of Classification Search
CPC ........ H03K 3/00; H03K 3/012; H03K 3/0372; H03K 3/0375; H03K 3/289; H03K 3/356034; H03K 3/35625
USPC ...................................................... 327/202
See application file for complete search history.

(56) References Cited

U.S. PATENT DOCUMENTS

| 5,986,490 | A | 11/1999 | Hwang et al. | |
|---|---|---|---|---|
| 6,396,309 | B1 | 5/2002 | Zhao et al. | |
| 7,855,587 | B1 | 12/2010 | Su | |
| 8,552,761 | B2 | 10/2013 | Kim | |
| 8,742,796 | B2 | 6/2014 | Dally et al. | |
| 10,340,900 | B2 | 7/2019 | Barn et al. | |
| 2009/0201063 | A1* | 8/2009 | Nomura | H03K 19/096 327/202 |
| 2012/0079334 | A1* | 3/2012 | Tam | G01R 31/318541 714/E11.155 |
| 2018/0123569 | A1* | 5/2018 | Hwang | H03K 3/356121 |
| 2018/0159512 | A1* | 6/2018 | Vrudhula | H03K 3/356139 |

* cited by examiner

*Primary Examiner* — Menatoallah Youssef
*Assistant Examiner* — Dave Mattison
(74) *Attorney, Agent, or Firm* — Kowert, Hood, Munyon, Rankin & Goetzel, P.C.; Erik A. Heter; Dean M. Munyon

(57) ABSTRACT

A flip-flop with glitch protection is disclosed. The flip-flop includes a differential amplifier circuit that generates amplifier output signals based on an input data and clock signals and precharges a true data node when a clock signal is inactive. A latch circuit is coupled to the differential amplifier and includes a latch node. Responsive to a current value of the input data signal having a first logic state, the latch node is set at a logic value equivalent to the precharged value during an active phase of the clock signal. Responsive to the current value of the input data signal having a second logic state complementary to the first, during the active phase of the clock signal, the latch circuit causes the latch node to be set to a logic value complementary to the precharged value, using the clock signal and the current value of the input data signal.

20 Claims, 10 Drawing Sheets

FLIP-FLOP CIRCUIT WITH GLITCH PROTECTION

BACKGROUND

Technical Field

This disclosure is directed to storage circuits, and more particularly, to flip-flop circuits.

Description of the Related Art

Flip-flop circuits are well known in digital electronics, and have a wide variety of types and uses. A flip-flop circuit typically includes inputs to receive data and a clock signal. For an edge-triggered flip-flop, the data provided to the inputs may be captured in response to an edge of the clock signal, stored into the latch, and subsequently output therefrom. Level-sensitive flip-flops are also used in some application, with the flip-flop being responsive to a particular state of a clock signal, rather than to the edge.

The applications of flip-flop circuits vary widely. For example, flip-flop circuits may be used in data path subsystems, finite state machines, registers and other temporary storage, timing circuits, testing circuits, and so on. The type of application may in some cases dictate the specific type of flip-flop used.

SUMMARY

A flip-flop with glitch protection is disclosed. In one embodiment, a flip-flop includes a differential amplifier circuit configured to generate amplifier output signals based on an input data signal and a clock signal. The differential amplifier circuit is further configured to precharge a true data node to a precharged value during an inactive phase of the clock signal. The flip-flop further includes a latch circuit coupled to the differential amplifier, with the latch circuit including a latch node. In response to a current value of the input data signal having a first logic state, the latch circuit is configured to cause the latch node to be set at a logic value equivalent to the precharged value during an active phase of the clock signal. In response to the current value of the input data signal having a second logic state that is complementary to the first logic state during the active phase of the clock signal, the latch circuit is configured to cause the latch node to be set to a logic value complementary to the precharged value, using the clock signal and the current value of the input data signal.

In one embodiment, the differential amplifier is configured to provide first and second amplifier output signals. The latch circuit includes a transfer circuit coupled to receive the first and second amplifier output signals, which may be provided at logic values equivalent to one another. When the input data signal is in a first logic state, the first amplifier output signal may cause a transistor of the transfer circuit to set the latch node to a second logic state. The second amplifier output signal may cause another transistor to block a current path from the latch node and thereby prevent a glitch that could otherwise occur if the same transistor was driven by, e.g., the clock signal.

BRIEF DESCRIPTION OF THE DRAWINGS

The following detailed description makes reference to the accompanying drawings, which are now briefly described.

DETAILED DESCRIPTION OF EMBODIMENTS

Figure 1:
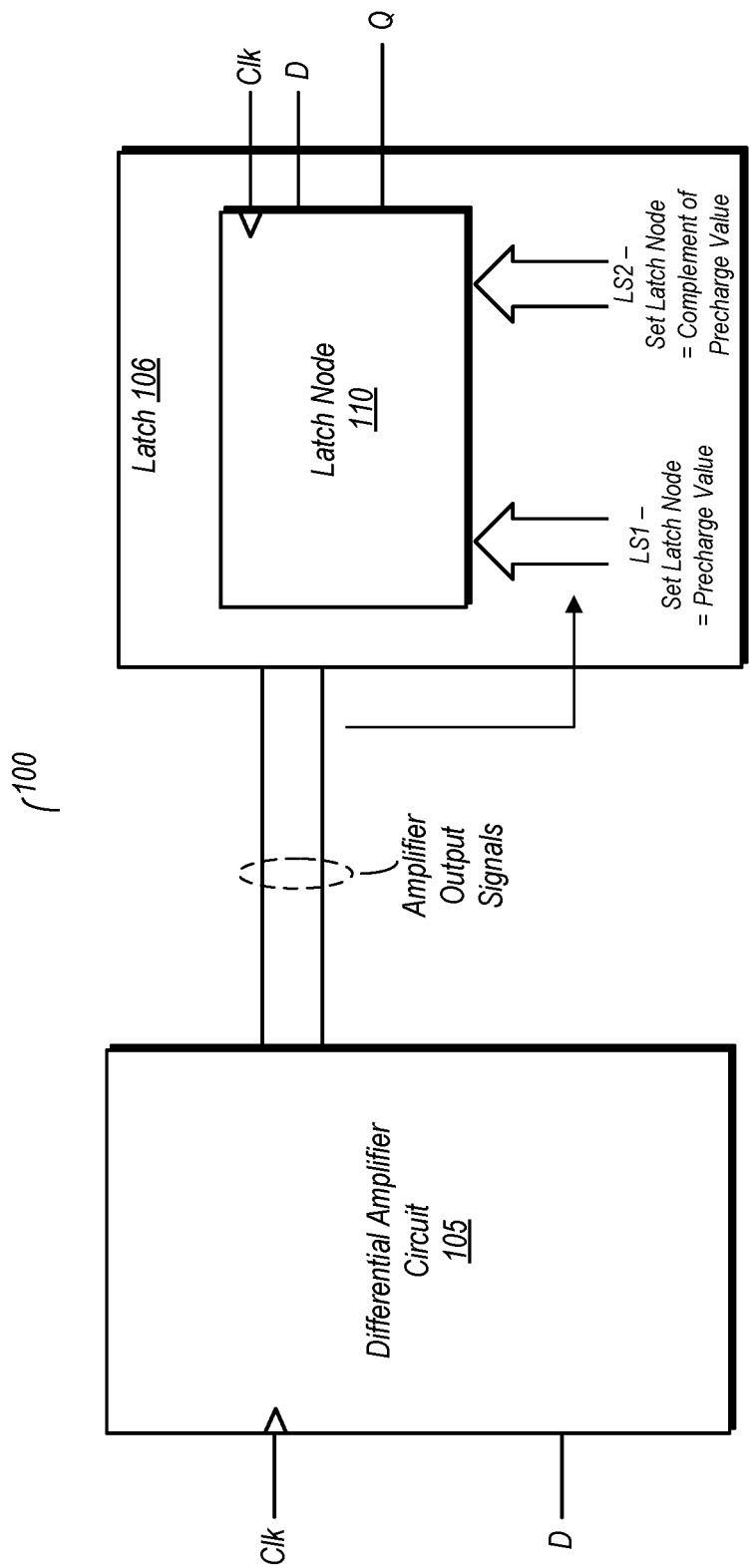
FIG. 1 is a block diagram of one embodiment of a flip-flop circuit.

Various embodiments of a flip-flop circuit are disclosed. Sense amplifier flip-flops are among the many types of flip-flop circuits available. In a sense amplifier flip-flop, an input stage may be implemented as a differential amplifier (which acts as the sense amplifier of the flip-flop). The differential amplifier includes first and second internal data nodes of a pair of cross-coupled inverters. These nodes may be precharged during an inactive phase of an input clock signal. When the clock signal becomes active, the input data causes one of the internal nodes to change logic states. One or more output signals based on these states are provided to a latch circuit, which may be implemented using a keeper circuit. The keeper circuit may, based on output signals provided from the differential amplifier, capture and output data corresponding to the input data signal.

One of the advantages of the sense amplifier flip-flop is the speed at which the output is provided. However, in certain circuit arrangements, a glitch can occur in which the output is temporarily propagated at an unintended state. When this glitch propagates downstream, it can cause malfunctions in other circuits. The glitch, which may be caused by propagation delay of certain signals including a first signal propagated from the differential amplifier, can be solved in some instances by adding circuitry and/or re-arranging certain connections. For example, in one embodiment of a sense amplifier flip-flop, an input data signal of D=0 can cause the glitch, thereby causing an undesired logic '1' to be propagated momentarily downstream. This may occur from the latch node being pulled low temporarily.

The present disclosure may solve the glitch problem in one particular embodiment by using a second signal conveyed from the differential amplifier. This second signal can be provided to a gate terminal of a transistor in a pulldown stack between the latch node and ground. More particularly, the second signal may prevent the transistor from being activated, thereby preventing the latch node from being momentarily pulled low before the data has fully settled. However, the second signal may propagate to the latch circuit slower than the first signal, which can negate the speed advantages of the keeper circuit for the case of D=1. Accordingly, the flip-flop circuit of the present disclosure adds a pre-driver to the latch circuit. In the case of D=1, when it is desirable to pull down the latch node, the pre-driver circuit may pull this node low before the second signal can cause activation of the corresponding transistor in the latch circuit. Accordingly, the latch node is pulled to its correct state for the given data input without having to wait on the second signal to propagate. As a result, the sense amplifier flip-flop of this particular embodiment may prevent occurrence of a glitch while still realizing the speed advantages of the keeper circuit.

It is noted that discussions such as that in the previous paragraph, where particular logic states are mentioned, are provided by way of example. These discussions are not intended to limit the disclosure to embodiment in which the logical states are the same as those discussed herein. The present disclosure contemplates a sense amplifier flip-flop that may operate according different logic states on different nodes during the operation than as described herein while still falling within the scope of this disclosure.

Various embodiments of a sense amplifier flip-flop and operation thereof are now described in further detail. The discussion begins with description of block diagrams of various embodiments of a sense amplifier flip-flop. Thereafter, a particular embodiment is described in accordance with a schematic diagram. The operation of one embodiment of the circuit is further illustrated by discussion of a timing diagram and annotated schematics that follow. An integrated circuit diagram that illustrates a use case of a sense amplifier flip-flop is then discussed, followed by a flow diagram further illustrating the operation of an embodiment. The description closes with discussion of an example embodiment of a system, followed by a system capable of manufacturing the circuit disclosed herein.

Sense Amplifier Flip-Flop Block Diagrams:

FIG. 1 is a block diagram of one embodiment of a sense amplifier flip-flop. In the embodiment shown, flip-flop 100 includes a differential amplifier circuit 105 and latch 106, which includes latch node 110. Differential amplifier circuit 105 performs the functions of a sense amplifier in the illustrated circuit, and is coupled to receive a clock signal, Clk, and an input data signal, D. Based on the clock signal and a logical state of the input data signal, differential amplifier circuit 105 generates a number of amplifier output signals that are provided to latch 106.

As will be discussed in further detail below, certain circuit nodes of the differential amplifier circuit 105 may be precharged (e.g., pulled to a logic high state) when the clock signal is inactive (e.g., the clock is low). When the clock becomes active, at least one of the precharged nodes changes states based on the logic state of the input data signal. During the active phase of the clock signal, the amplifier output signals are generated by differential amplifier circuit 105 based on the logic state of the input data signal.

Latch 106 in the embodiment shown is also coupled to receive the clock signal and the input data signal. Latch 106 is further configured to generate an output signal Q (and may also generate its complement) based on the states of the amplifier output signals, which in turn are dependent on the state of the input data signal as received by differential amplifier circuit 105. The state of the output signal is in turn dependent on the state of latch node 110, which may be determined by the amplifier output signals and/or the input data and clock signals as provided to latch 106 when the clock signal is active.

In the embodiment shown, if the input data signal is received by flip-flop 100 in a first logic state (LS1), the latch node is set to a logical value equivalent to the precharge value (e.g., a logic high/logic 1). This may occur in response to the state of one of the amplifier output signals. If the input data signal is received by flip-flop 100 in a second logic state (LS2), the latch node may be set to a logic value (e.g., logic low/logic 0) that is a complement of the precharge value. This may occur in response to the input data signal and the clock signal as received by latch 106.

Figure 2:
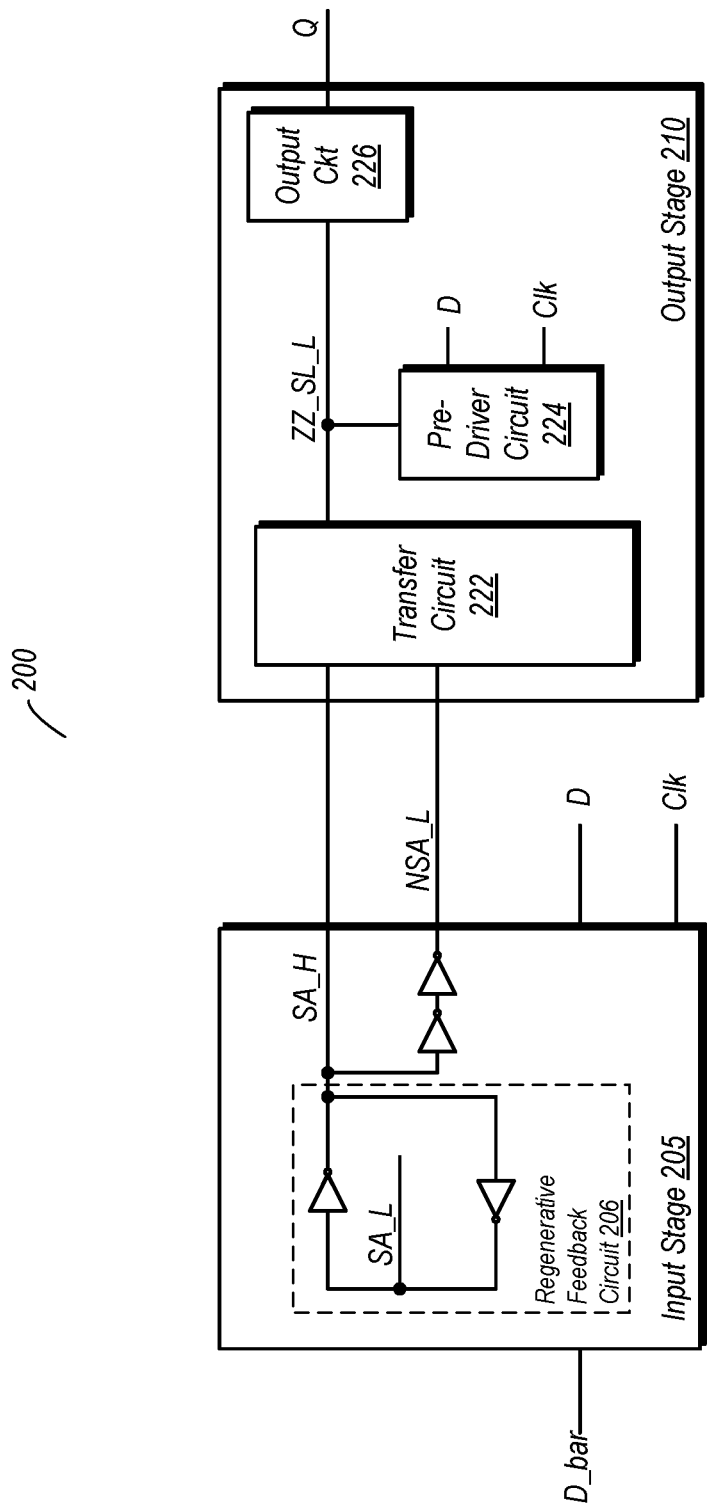
FIG. 2 is a block diagram of another embodiment of a flip-flop circuit.

FIG. 2 is a block diagram of another embodiment of a sense amplifier flip-flop. In the embodiment shown, flip-flop 200 includes an input stage 205 (which may be a differential amplifier as shown in FIG. 1), and an output stage 210 (which may be a latch circuit as shown in FIG. 1). Input stage 205 in the embodiment shown is configured to receive a data input signal D, a complement of the data input signal, D_bar, and the clock signal. The input stage 205 includes a regenerative feedback circuit 206 having a pair of cross-coupled inverters. The outputs of these inverters are internal data nodes SA_H and SA_L that may be precharged when the clock signal is inactive. When the clock signal becomes active, one of these nodes changes its logical state, the other remaining in its precharged state. The node on which a state change occurs depends on the logic state of the input data signal. Input stage 205 is configured to provide two output signals, a first from the data node SA_H, and a second from the node NSA_L. As indicated by the two inverters coupled between SA_H and NSA_L, these two signals are provided in logically equivalent states when the clock signal is active. However, due to the inversions encountered in the generation of NSA_L, this signal may be provided later than SA_H, depending on the logic state of the data input signal.

Output stage 210 in the embodiment shown includes a transfer circuit 222, a pre-driver circuit 224, and an output circuit 226. Transfer circuit 222 is coupled to receive the output signals, via nodes SA_H and NSA_L, from input stage 205. Both transfer circuit 222 and pre-driver circuit 224 are coupled to a latch node, ZZ_SL_L. When the clock signal becomes active, the resulting state of the latch node is dependent on the logical state of the input data signal. Furthermore, one of either transfer circuit 222 or pre-driver circuit 224 may effectuate the change of logical state on the latch node, depending on the logical state of the input data signal.

In the embodiment shown, when the input data signal D is received as a logic 0, SA_H is generated at a logic 0 and provided to transfer circuit 222. Responsive to the logic 0 on SA_H and the transitioning of the clock signal to the active state, the latch node is driven to a logical value equivalent to that of the precharge state (e.g., logic high/logic 1) by transfer circuit 222. If the input data signal is received as a logic 1, pre-driver circuit 224 operates to drive the latch node to a logical complement of the precharge state (e.g., logic low/logic 0) when the clock signal transitions high.

Although not explicitly shown in this example, output stage 210 may also include storage circuitry arranged to store a most recent logic value of the data input signal after the clock signal transitions back to the inactive stage. The output circuit may thus provide the output signal, Q, at its most recently latched state until the next transition.

Figure 3:
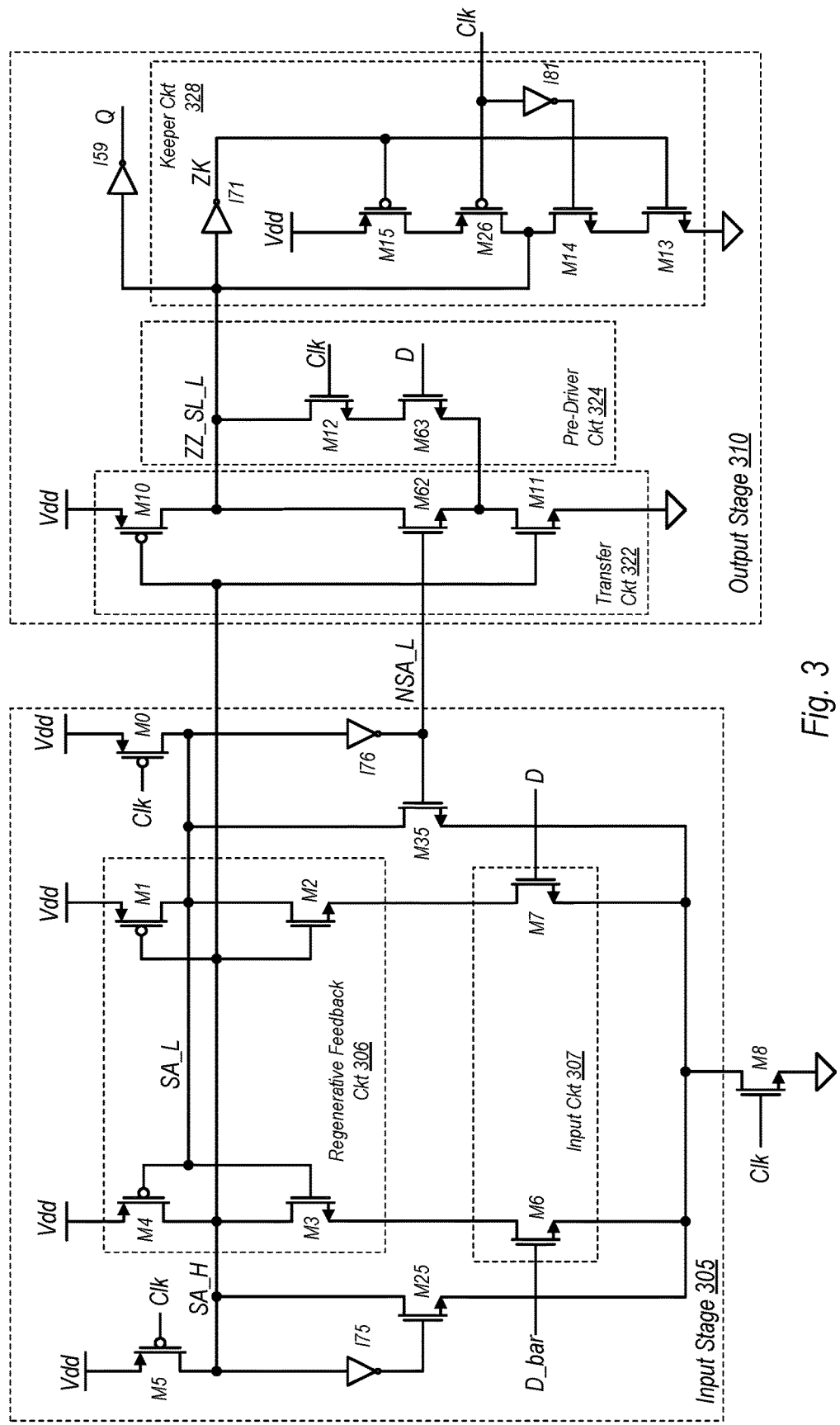
FIG. 3 is a schematic diagram of one embodiment of a flip-flop circuit.

Schematic Diagram of Sense Amplifier Flip-Flop Embodiment:

FIG. 3 is a schematic diagram of one embodiment of a sense amplifier flip-flop. In the embodiment shown, flip-flop 300 includes an input stage 305 and an output stage 310. Input stage includes a regenerative feedback circuit 306 and an input circuit 307, along with other circuitry to be discussed below. Output stage 310 includes a transfer circuit 322, a pre-driver circuit 324, and a keeper circuit 328. Inverter I59 functions as an output circuit in this embodiment, and provides the output signal Q at a value logically complementary to the signal value on the latch node, ZZ_SL_L.

Input stage 305 includes a transistor M8 coupled to receive the clock signal on its respective gate terminal. When the clock signal is active, thereby activating transistor M8, a pulldown path to ground is activated through one of the legs of input stage 305, depending on the logical state of the input data signal. The clock signal is also received on respective gate terminals of transistors M0 and M5. These two devices act as precharge circuitry in the embodiment shown. When the clock signal is low (its inactive state in this particular embodiment), M0 is activated to pull the internal data node SA_L toward supply voltage Vdd and thus to a logic high voltage. Similarly, a low clock signal received on the gate terminal of M5 causes this device to activate, thereby precharging SA_H to a logic high voltage. The logic high voltage on the internal data node SA_L results in a logic low on the node NSA_L (and thus the gate terminal of M35) due to inverter I76. Similarly, the logic high on internal data node SA_H results in a logic low on the gate terminal of M25. The precharging of SA_H and SA_L also causes activation of M2 (due to SA_H being high) and M3 (due to SA_L being high).

The input data signal, D, is received in its true form on the gate terminal of M7, while the complement of the input data signal, D_bar, is received on the gate terminal of M6. These two devices comprise the input circuit 307 in this particular embodiment. When the true value of the input data signal is a logic high, transistor M7 is active. When the clock signal transitions to the active state, thereby turning on transistor M8, a pulldown path is created through transistor M7 (due to the logic high on D) and M2 (active by virtue of the precharge of SA_H). Accordingly, SA_L is pulled low, while SA_H remains high. The low on SA_L results in a logic high on NSA_L, and thus M35 is activated to create a second, parallel pulldown path with that through M2 and M7.

When the input data signal D is a logic low voltage, and thus D_bar is a logic high voltage, the activation of the clock signal creates a pulldown path between SA_H and ground through M8, M6, and M3 (the later being active by virtue of the precharge). Accordingly, SA_H is pulled low while SA_L remains high by virtual of the precharge. The low on SA_H results in a high output from 175, and thus the activation of M25. This creates a pulldown path in parallel with that through M6 and M3.

Output stage 310 also includes keeper 328, which includes inverter I71 and is coupled to the latch node thereby. Keeper 328 in the embodiment shown includes a clocked inverter circuit comprising M13, M14, M15, and M26, along with inverter I81. The output of inverter I71, on node ZK, is a complement to the logic state stored on the latch node. When the clock is inactive low, M26 is active, as is M14 (by virtue of the high output from I81. With both of these transistors active, one of M15 or M13 is active, depending on the logic state present on node ZK. If ZK is a logic low, M15 is activated, and the latch node is pulled high. If ZK is a logic high, M13 is active, and the latch node is pulled low. In either case, the keeper 328 maintains the most recent state of the latch node just prior to the clock signal transitioning from the active state to the inactive state.

When the clock signal is active, the state of the latch node may be set by either transfer circuit 322 or pre-driver circuit 324, depending on the logic state of the input data signal. When the input data signal is low (e.g., D=0), SA_H is provided as a low to transfer circuit 322. This causes activation of M10, which pulls the latch node high. With the latch node pulled high, Q is output low from flip-flop 300. Similarly, inverter I71 outputs a low onto the ZK node.

Since SA_L is high at this time (from the precharge), NSA_L is output from inverter I76 as a low, which prevents activation of M62. This in turn may prevent the glitch that could occur in other circuit configurations. For example, if the gate terminal of M62 were controlled by a clock signal, the transitioning of the clock signal high would cause a pulldown path to be present between the latch node and ground until SA_H could be pulled low and activate M10 to pull the latch node high. This glitch could, for example, cause other circuits downstream from flip-flop 300 to malfunction. However, the circuit arrangement shown here, using NSA_L to control M62, prevents activation of the pulldown path when the input data signal is a logic low While the use of NSA_L to control M62 prevents the glitch when the input data signal is a logic low, it can create a delay for the case in which the input data signal is a logic high. When the input signal is a logic high, NSA_L does not immediately transition to a logic high. Instead, SA_L is pulled down first, and subsequently I76 drives NSA_L high to activate M62 to create the pulldown path between the latch node and ground. Thus, in the embodiment shown, multiple gate delays occur between the time the clock signal transitions to the active phase and the time the latch node is pulled low through M62. Left unmodified, the circuit would lose some of the speed advantage provided by the keeper circuit arrangement used in this embodiment. However, the addition of pre-driver circuit 324 overcomes this problem.

When the data input signal is provided as a logic high, it is also received on the gate terminal of M63 of pre-driver circuit 324. Thus, when the clock signal transitions to the active state (high in this embodiment), the latch node is pulled low even though M62 is initially inactive at the time of the clock transition. Accordingly, pre-driver circuit 324 obviates most of the gate delay that would otherwise prevent the latch node from being pulled low. After SA_L is pulled low and NSA_L subsequently transitions high, M62 is activated to form a pulldown path in parallel with that created by pre-driver circuit 324.

Therefore, the combination of pre-driver circuit 324 and the use of NSA_L to control the M62 allows flip-flop 300 to maintain the desired operating speed while also preventing the glitch. Using NSA_L as the controlling signal for M62 prevents the glitch from occurring in the illustrated embodiment when the input data signal is a logic low. The presence of pre-driver circuit 324 allows for fast operation by eliminating the delay in pulling the latch node low that would occur in its absence with M62 controlled by NSA_L when the data input signal is a logic high.

Figure 4:
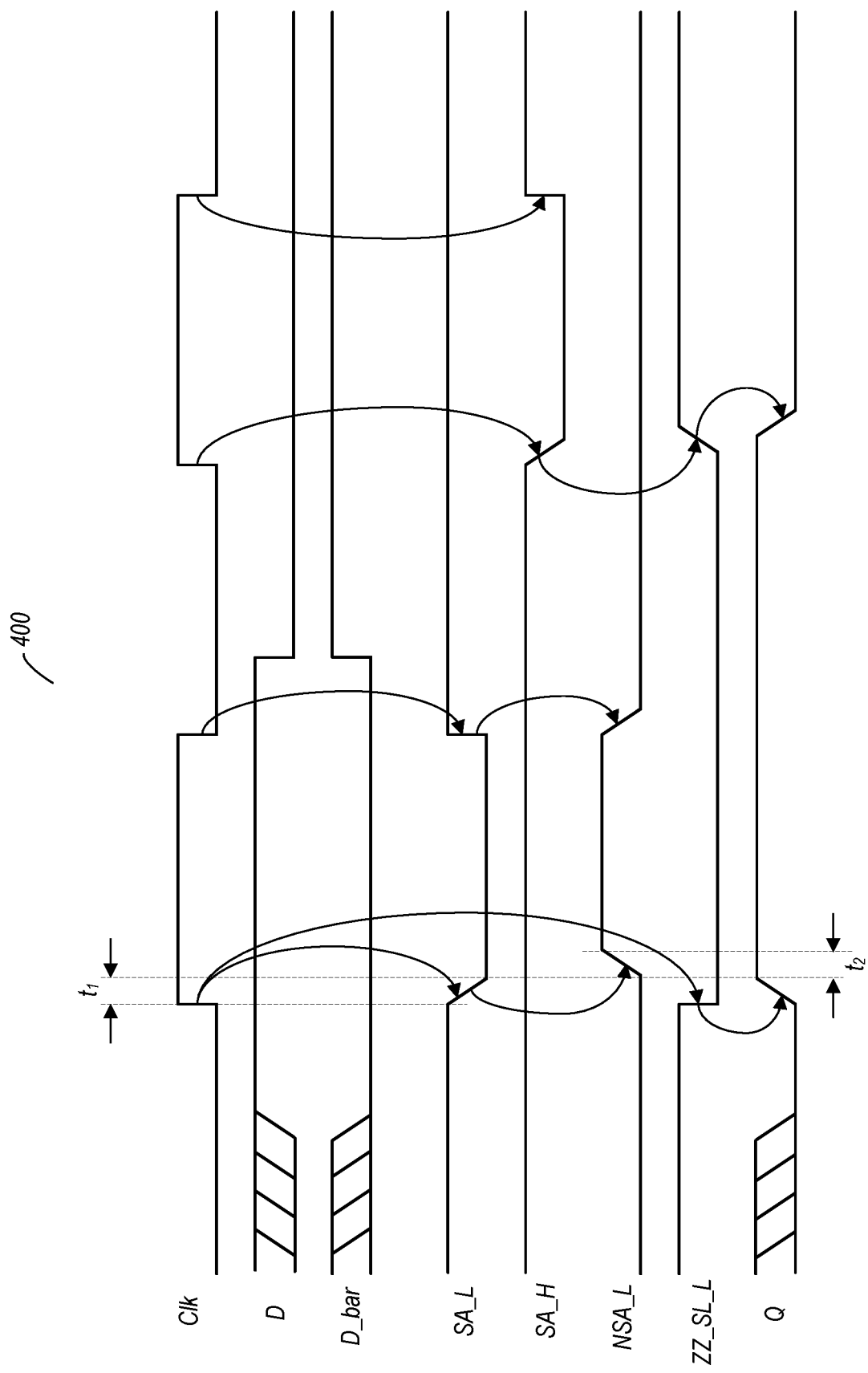
FIG. 4 is a timing diagram illustrating operation of one embodiment of a flip-flop circuit.

Timing Diagram and Annotated Schematics to Illustrate Circuit Operation:

FIG. 4 is a timing diagram illustrating operation of one embodiment of a flip-flop circuit. More particularly, timing diagram 400 illustrates the operation of flip-flop 300 of FIG. 3, while further illustrating the timing problem that would occur in the absence of the pre-driver circuit.

In the example shown, the initial conditions include the clock in its low, inactive state, with SA_L and SA_H both precharged high. NSA_L is low as a result of the high on SA_L. The latch node, ZZ_SL_L, is high from a previous clock cycle. Prior to the clock entering the active phase the input data signal D is received as a logic high, while its complement, D_bar, is received as a logic low.

At the transition of the clock from its inactive, low phase, to the active, high phase, SA_L begins to fall low due to the logic high on the D input. The amount of time for SA_L to fall low is indicated by time $t_1$. The low on SA_L eventually causes NSA_L to transition high. The amount of time for NSA_L to transition high is indicated by time $t_2$. Thus, the time between the transitioning of the clock signal to the active phase and the transitioning of NSA_L to a logic high may be expressed by the time $t_1+t_2$. This may represent a significant delay, and if the transitioning of latch node ZZ_SL_L were dependent on NSA_L, the timing could be unacceptable for many applications of the circuit. However, since the circuit of FIG. 3 includes the pre-driver circuit 324, ZZ_SL_L transitions from high to low very quickly after the clock transitions to the active phase, and in significantly less time than $t_1+t_2$. Accordingly, the speed advantage of the circuit is maintained.

After the clock transitions back to the inactive phase again, the latch node ZZ_SL_L is held low by the keeper. Meanwhile, SA_L and SA_H are both precharged to logic high levels responsive to the falling edge of the clock signal. Additionally, NSA_L falls low due to the precharge of SA_L. In the example shown, the input data signal D transitions from high to low during the inactive clock phase, with its complement correspondingly transitioning from low to high.

At the next clock edge, the low-to-high transition of the clock results in SA_H being pulled low. Responsive to the low on SA_H, the latch node ZZ_SL_L is pulled high, with the output Q correspondingly falling low. Additionally, since NSA_L remains low through the transition, due to the high on SA_L, the previously mentioned glitch is prevented. At the next high-to-low transition of the clock signal, SA_H is precharged high, while SA_L remains high. The output Q remains low due to the operation of the keeper in the output stage.

Figure 5:
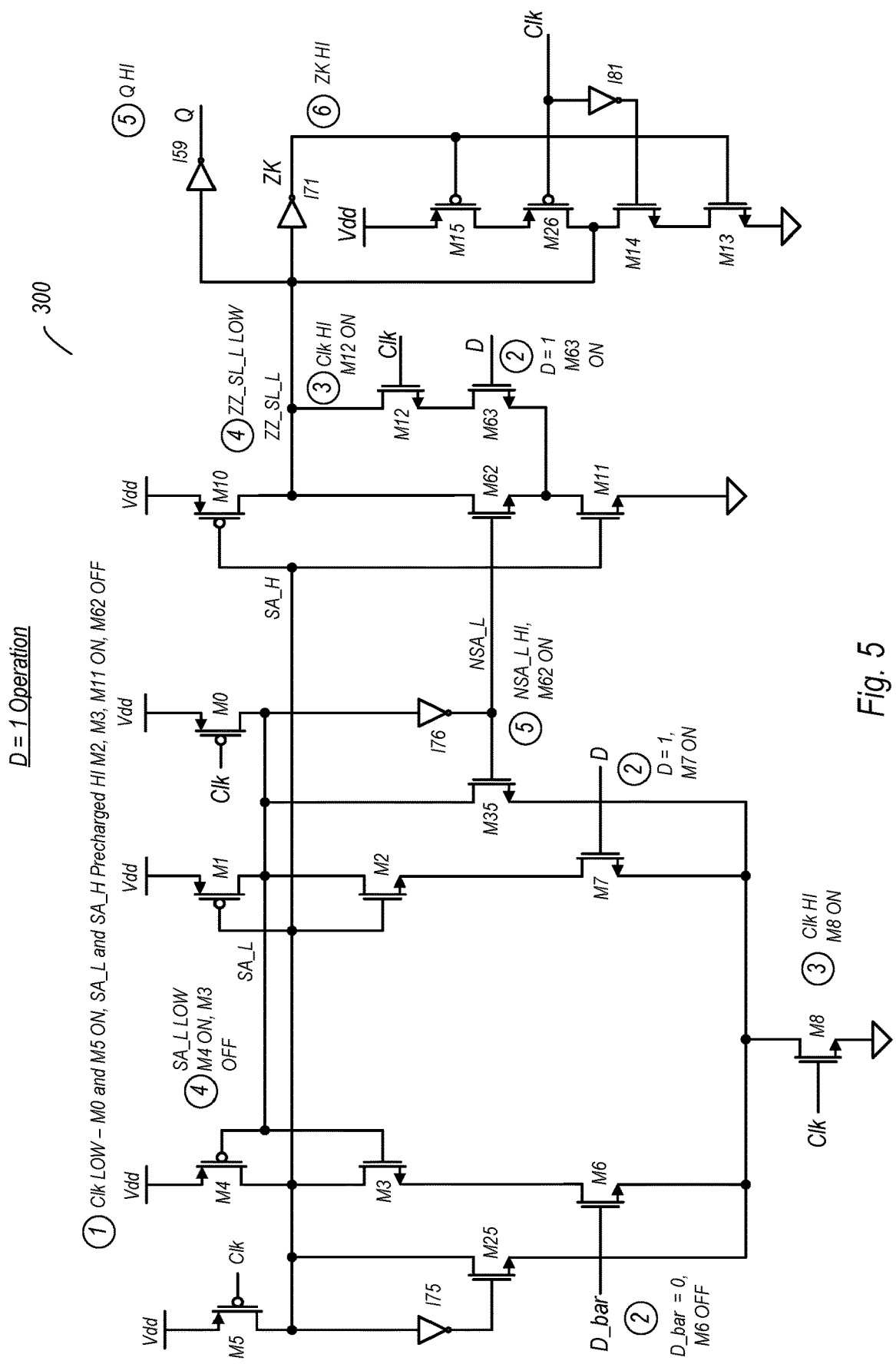
FIG. 5 is a schematic diagram further illustrating operation of one embodiment of a flip-flop circuit.

FIG. 5 is an annotated schematic illustrating operation of an embodiment of flip-flop 300 for the case where the input data D=1 (logic high). At (1) in the illustrated example, the clock signal is low (inactive phase). Transistors M0 and M5 are both on, thereby precharging internal data nodes SA_L and SA_H, respectively. At (2), the data input signal D is received at a logic 1/logic high on the gate terminal of M7, with D_bar being received at the complementary logic value on the gate terminal of M6. At (3), the clock signal transitions from the inactive phase (low) to the active phase (high), thereby activating M8 and completing a pulldown path between SA_L and ground, through M2 and M7. Additionally, at (3), the transitioning of the clock signal to the active phase causes activation of M12. Since SA_H is high at the clock edge (due to the precharge), M1l is also turned on, as is M63 due to the input data signal D being at a logic high level. Accordingly, the activation of M12 responsive to the rising clock edge creates a pulldown path through M11, M63, and M12.

At (4), the pulldown path activated through M11, M63, and M12 results in the lath node ZZ_SL_L being pulled low. Furthermore, SA_L is low, causing M4 to turn on while M3 is turned off.

The activation of M4 holds SA_H at its precharged logic high level. With SA_L low, NSA_L is transitioned to a logic high, at (5), due to inverter I76. The high on NSA_L thus results in the activation of M62, thereby creating a second pulldown path between the latch node and ground (through M62 and M11). Additionally, at (5), the logic low on the latch node results in inverter I59 outputting a logic high on the Q output of flip-flop 300.

At (6), after the clock signal falls low again, the keeper node ZK is held high by the output of inverter I71, while the latch node is held low by the pulldown path through M14 and M13.

Figure 6:
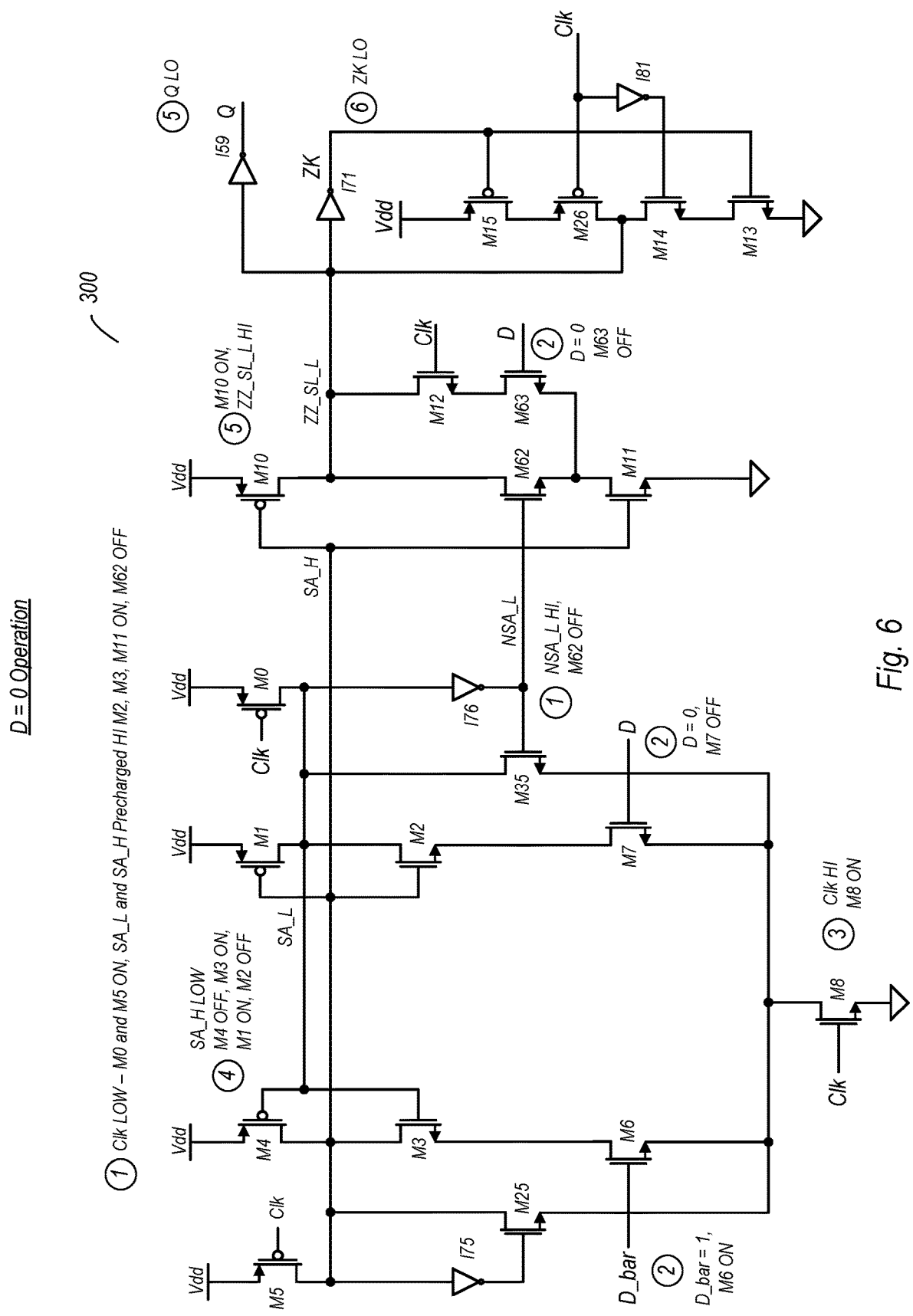
FIG. 6 is a schematic diagram further illustrating operation of one embodiment of a flip-flop circuit.
Figure 7:
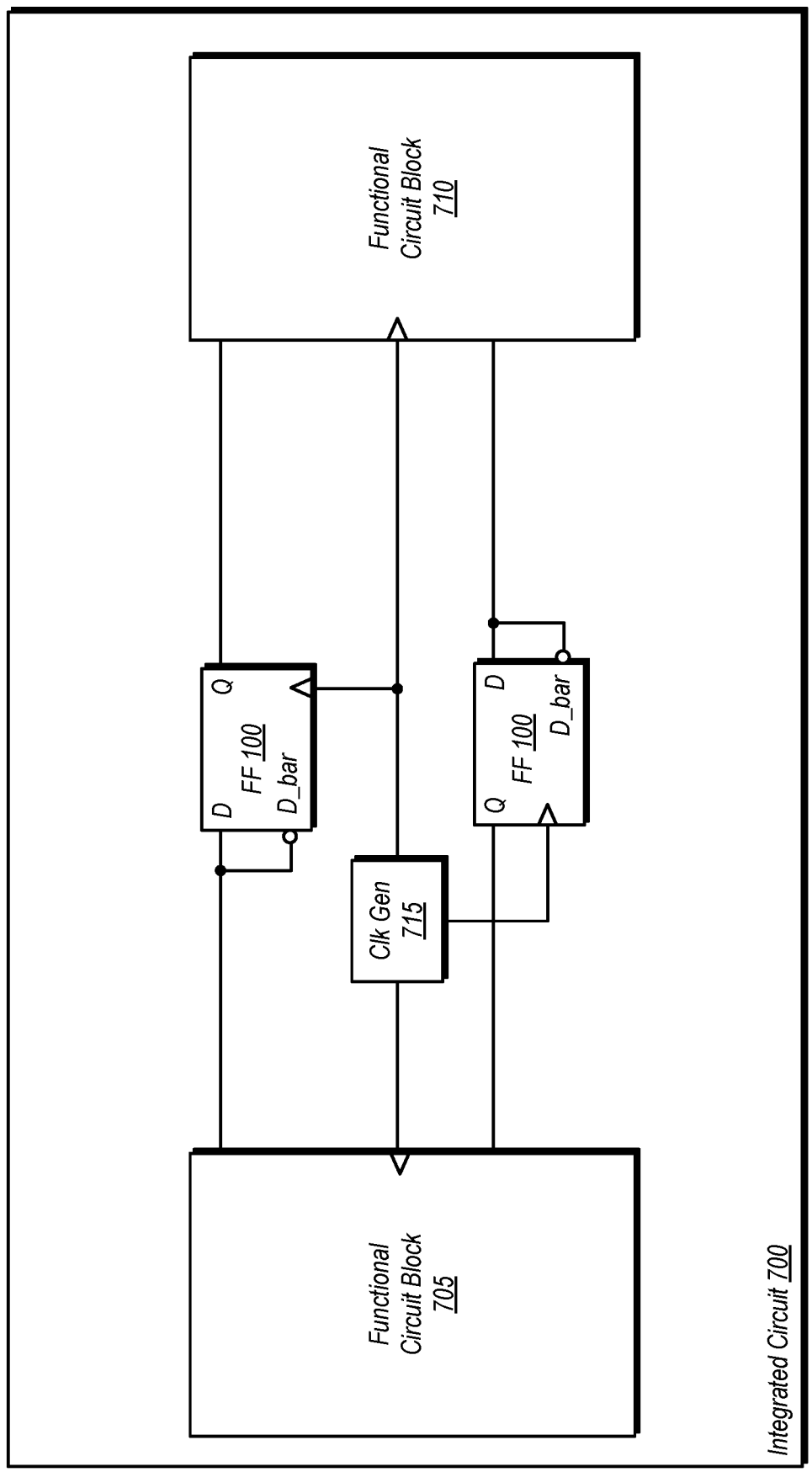
FIG. 7 is a block diagram of one embodiment of an integrated circuit having a data path including flip-flop circuits.

FIG. 6 is an annotated schematic illustrating operation of an embodiment of flip-flop 300 for the case where the input data D=0 (logic low). At (1), with the clock signal low, M0 and M5 are active and thus SA_L and SA_H are precharged to logic high levels. Furthermore, with SA_L precharged high, the output of inverter I76, NSA_L, is low, and thus M62 is off. At (2), the input data signal is received at a logic 0/logic low, while D_bar is received as a logic 1/logic high. At (3), the clock signal transitions from low to high, thereby activating M8.

With M8 active, a pulldown path between SA_H and ground, through M6 and M3 is completed. Accordingly, at (4), SA_H is pulled low, with transistor M4 being in the off state while M3 remains on. Furthermore, as the clock transitions from low to high, NSA_L remains low (due to the precharge of SA_L), and thus M62 remains off. This prevents occurrence of the previously discussed glitch. At (5), M10 is activated as a result of the low on SA_H, and thus ZZ_SL_L is pulled high. As a result, I59 outputs a logic low on the Q output of flip-flop 300.

At (6), the clock falls low again, and thus the logic low output from I71 on the keeper node ZK combines with the low clock signal to create a pull-up path between the latch node and Vdd, through M26 and M15.

Integrated Circuit Example:

FIG. 6 is a block diagram of one embodiment of an integrated circuit, and is provided to illustrate one possible use for an embodiment of the flip-flop circuit discussed above. It is noted that this example is in no way intended to be limiting, as flip-flops may be used in a wide variety of applications. Integrated circuit 700 in the embodiment shown includes functional circuit blocks 705 and 710. These two functional circuit blocks are coupled to one another by signal paths that include instances of a flip-flop 100 implemented there between. A clock generation circuit 715 is configured to generate a clock signal that is provided to both of flip-flops 100 and functional circuit blocks 705 and 710.

In some integrated circuits, such as integrated circuit 700, the placement of circuitry of various functional circuit blocks can be limited by area restrictions. In this example, functional blocks 705 and 710 are placed near opposite ends of the integrated circuit. Nevertheless, the two functional circuit blocks may communicate with one another for various reasons. However, due to the distance between the two functional blocks, conveying a signal from one to the other may come with certain challenges. One challenge is timing, as it may be desirable to operate the integrated circuit at clock speeds that do not permit the signal to propagate between the two functional circuit blocks within a single clock cycle. Additionally, factors such as capacitance in the signal path may add difficulty in maintaining a signal at its intended logic state. Accordingly, the implementation of flip-flops 100 between the two signal paths may be used to maintain the integrity and timing of signals transmitted between the two functional circuit blocks 705 and 710. In a first clock cycle, a signal may be transmitted from one of the functional circuit blocks to a flip-flop 100. The logic state of the signal may be captured and stored in flip-flop 100, and a corresponding signal may be transmitted on the next clock cycle. Thus, in the example shown, the presence of flip-flops 100 may break up the long signal paths into two shorter paths over which signals can be transmitted and received within the timing constraints imposed by the desired clock speed while also maintaining integrity of the transmitted logic value.

Figure 8:
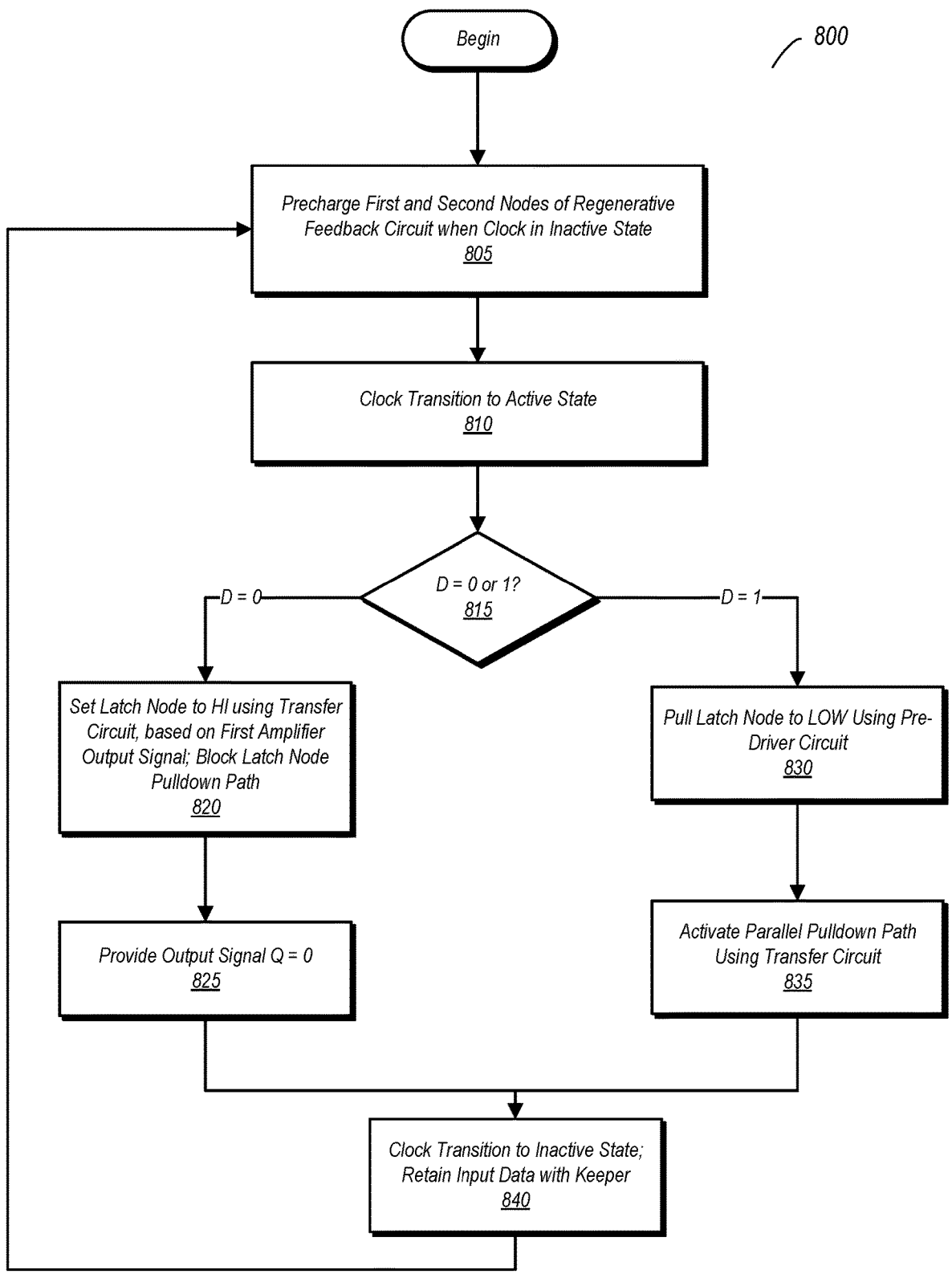
FIG. 8 is a flow diagram illustrating the operation of one embodiment of a flip-flop circuit.

Method Flow Diagram:

FIG. 8 is a flow diagram illustrating the operation of one embodiment of a flip-flop circuit. Method 800 as illustrated in FIG. 8 may be performed by any of the circuit embodiments discussed above and shown in the various figures of this application. Furthermore, embodiments of a flip-flop circuit capable of carrying out Method 800, but not otherwise disclosed herein, can be considered to fall within the scope of this disclosure.

Method 800 begins with precharging first and second nodes of a regenerative feedback circuit when a clock signal is in an inactive state (block 805). After a certain amount of time in the inactive state, the clock signal transitions to an active state (block 810). If the input data signal D provided to the flip-flop is in the D=0 state (block 815, D=0), a latch node is set to a logic high, using a transfer circuit and based on a first amplifier output signal, while blocking a pulldown path between the latch node and ground (block 820). The blocking of the pulldown path may prevent a glitch that could temporarily pull the latch node down before setting at a logic high value. As a result of the logic high on the latch node, the flip-flop circuit provides the output signal Q as a logic 0 (block 825). After a certain amount of time in the active state, the clock signal transitions to the inactive state, while the input data is retained using a keeper (block 840). The method then returns to block 805.

In the case where D=1 (block 815, D=1), the circuit operates to pull the latch node low using a pre-driver circuit (block 830). It is noted that the pulling low of the latch node by the pre-driver circuit when D=1 is not dependent on operation of the transfer circuit. Thereafter, however, the transfer circuit activates a parallel pulldown path (block 835). After a certain amount of time, the clock signal transitions back to the inactive state and the input data is retained with a keeper (block 840). Again, the method then returns to block 805.

Figure 9:
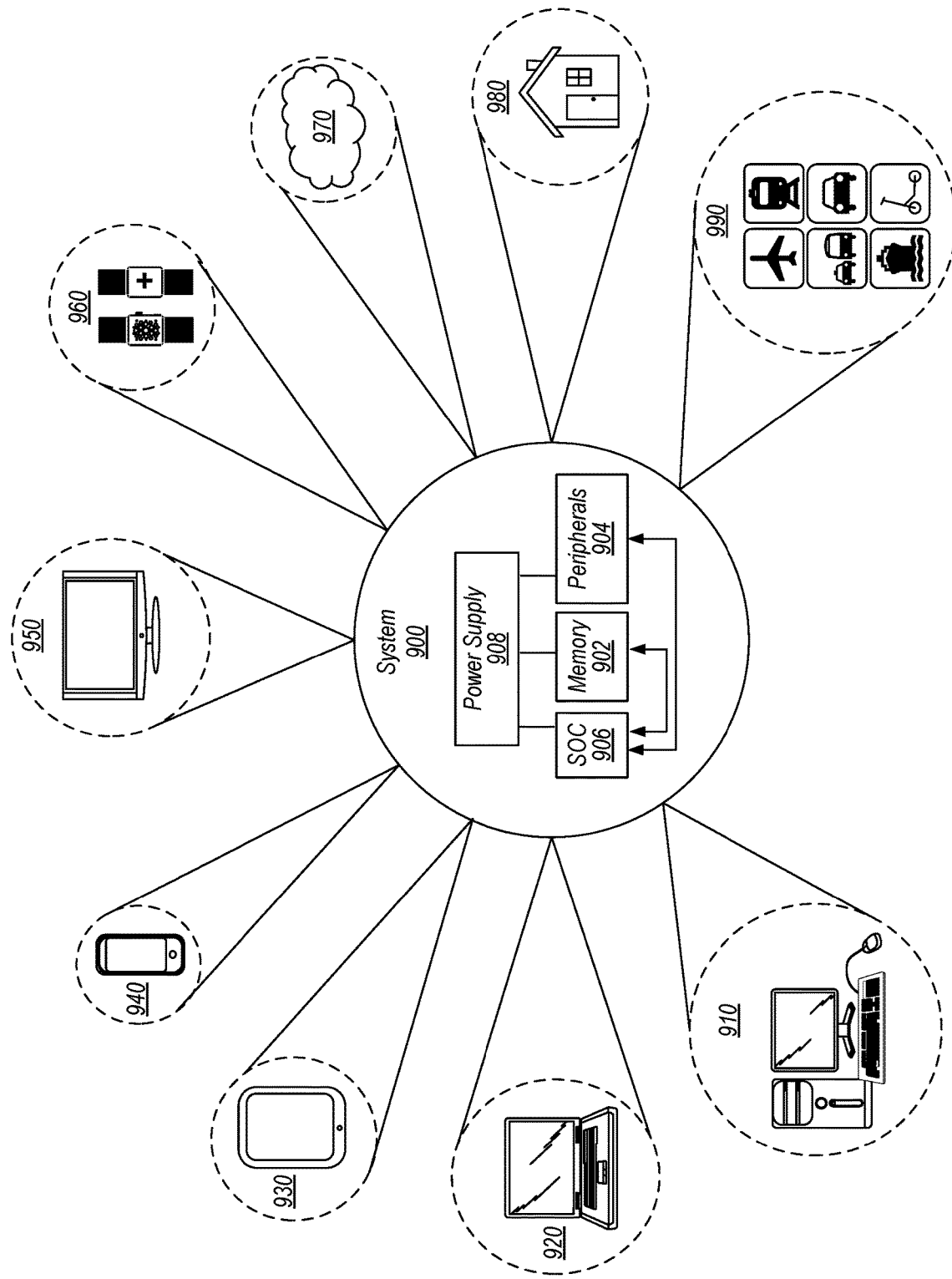
FIG. 9 is a block diagram of one embodiment of an example system.

Example System:

Turning next to FIG. 9, a block diagram of one embodiment of a system 900 is shown that may incorporate and/or otherwise utilize the methods and mechanisms described herein. In the illustrated embodiment, the system 900 includes at least one instance of a system on chip (SoC) 906 which may include multiple types of processing units, such as a central processing unit (CPU), a graphics processing unit (GPU), or otherwise, a communication fabric, and interfaces to memories and input/output devices. In some embodiments, one or more processors in SoC 906 include multiple execution lanes and an instruction issue queue. In various embodiments, SoC 906 is coupled to external memory 902, peripherals 904, and power supply 908.

A power supply 908 is also provided which supplies the supply voltages to SoC 906 as well as one or more supply voltages to the memory 902 and/or the peripherals 904. In various embodiments, power supply 908 represents a battery (e.g., a rechargeable battery in a smart phone, laptop or tablet computer, or other device). In some embodiments, more than one instance of SoC 906 is included (and more than one external memory 902 is included as well).

The memory 902 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 904 include any desired circuitry, depending on the type of system 900. For example, in one embodiment, peripherals 904 includes devices for various types of wireless communication, such as Wi-Fi, Bluetooth, cellular, global positioning system, etc. In some embodiments, the peripherals 904 also include additional storage, including RAM storage, solid state storage, or disk storage. The peripherals 904 include user interface devices such as a display screen, including touch display screens or multi-touch display screens, keyboard or other input devices, microphones, speakers, etc.

As illustrated, system 900 is shown to have application in a wide range of areas. For example, system 900 may be utilized as part of the chips, circuitry, components, etc., of a desktop computer 910, laptop computer 920, tablet computer 930, cellular or mobile phone 940, or television 950 (or set-top box coupled to a television). Also illustrated is a smartwatch and health monitoring device 960. In some embodiments, smartwatch may include a variety of general-purpose computing related functions. For example, a smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 900 may further be used as part of a cloud-based service(s) 970. For example, the previously mentioned devices, and/or other devices, may access computing resources in the cloud (i.e., remotely located hardware and/or software resources). Still further, system 900 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 9 is the application of system 900 to various modes of transportation. For example, system 900 may be used in the control and/or entertainment systems of aircraft, trains, buses, cars for hire, private automobiles, waterborne vessels from private boats to cruise liners, scooters (for rent or owned), and so on. In various cases, system 900 may be used to provide automated guidance (e.g., self-driving vehicles), general systems control, and otherwise. These any many other embodiments are possible and are contemplated. It is noted that the devices and applications illustrated in FIG. 9 are illustrative only and are not intended to be limiting. Other devices are possible and are contemplated.

In various embodiments of system 800, one or more instances of a delay circuit, as discussed above, is implemented. For example, SOC 806 may be an integrated circuit that includes one or more instances of a delay circuit in one of the various embodiments falling within the scope of this disclosure.

Figure 10:
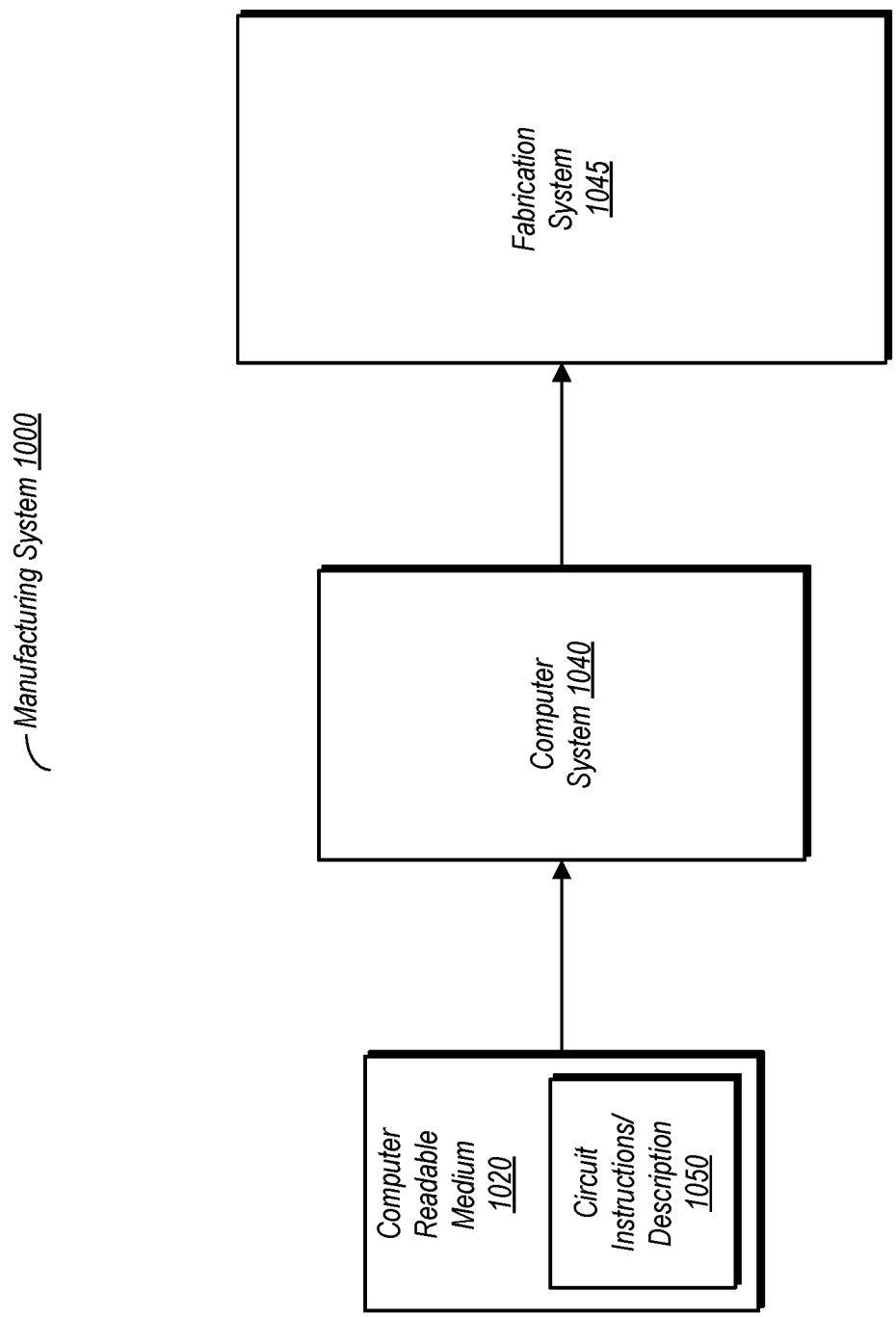
FIG. 10 is a block diagram illustrating one embodiment of a computer system, a computer readable medium, and a fabrication system.

Computer Readable Medium and Fabrication System:

FIG. 10 is a block diagram of one embodiment of a manufacturing system 1000. The system includes a non-transitory computer readable medium 1020 having stored thereon a instructions/description 1050 of a delay circuit of any one of the embodiments falling within the scope of this disclosure. The computer readable medium 1020 may be one of a number of different types of non-transitory media, including disk storage, solid state drive (e.g., using flash memory), optical storage (e.g., CD-ROM), various types of random access memory (RAM), and so on, that are capable of providing persistent storage of information.

A computer system 1040 is configured to read the circuit instructions/description 950 from computer readable medium 1020. Furthermore, computer system 2040 may execute the various instructions and used the circuit description to cause fabrication system 1045 to manufacture one or more instances of the circuit represented by circuit instructions/description 950. Fabrication system 1045 may be any type of automated system that can manufacture electronic circuits, such as an integrated circuit.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on.

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed. FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices e.g., flip-flops, registers, latches, etc., finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a differential amplifier circuit configured to generate a plurality of amplifier output signals based on an input data signal and a clock signal, wherein the differential amplifier is configured to precharge a true data node to a precharged value during an inactive phase of the clock signal; and
   a latch circuit that includes a latch node, wherein the latch circuit is coupled to the differential amplifier circuit and further includes:
      a transfer circuit configured to, in response to a current value of the input data signal having a first logic state, cause the latch node to be set at a logic value equivalent to the precharged value during an active phase of the clock signal and further configured to establish a path to a ground node in response to the precharge of the true data node; and
      a pre-driver circuit having a device coupled to receive the input data signal and configured to, in response to the current value of the input data signal having a second logic state concurrent with the clock signal transitioning to the active phase, cause the latch node to be set to a logic value complementary to the precharged value, using the clock signal and the current value of the input data signal, by discharging the latch node to ground through the path to ground of the transfer circuit.

2. The apparatus of claim 1, wherein in response to the current value of the input data signal having the first logic state, the differential amplifier is configured to generate first and second ones of the plurality of amplifier output signals at the current value of the input data signal during the active phase of the clock signal, wherein the latch circuit is configured to cause, using the first one of the amplifier output signals, the latch node to be set at a logic value complementary to the current value of the input data signal.

3. The apparatus of claim 2, wherein the differential amplifier is configured to set the first one of the plurality of amplifier output signals to the first logic state prior to setting the second one of the plurality of amplifier output signals to the first logic state.

4. The apparatus of claim 2, wherein the latch circuit is coupled to receive the input data signal and the clock signal, wherein the latch circuit is configured, in response to receiving an active clock signal and an input data signal having the second logic state, to begin to pulldown the precharged value prior to receiving the second one of plurality of amplifier output signals that are generated responsive to the active clock signal.

5. The apparatus of claim 4, wherein the pre-driver circuit includes a first transistor coupled to the latch node and a second transistor coupled to the first transistor, wherein gate terminals of the first and second transistor are coupled to receive the clock signal and a true version of the input data signal, respectively.

6. The apparatus of claim 2, wherein the transfer circuit is configured to set the latch node to one of the first or second logic states dependent on the plurality of amplifier output signals, wherein the transfer circuit is further configured to inhibit a change of the latch node from a logic value equivalent to the precharged value to the logic value complementary to the precharged value in response to the second one of the plurality of amplifier output signals being at the logic value complementary to the precharged value.

7. The apparatus of claim 1, wherein the differential amplifier includes:
   a regenerative feedback circuit including the true data node and a complementary data node, wherein the true data node is coupled to convey a first one of the plurality of amplifier output signals;

first and second precharge circuits configured to precharge the true and complementary data nodes, respectively, during the inactive phase of the clock signal.

8. The apparatus of claim 7, the differential amplifier further includes an input circuit coupled to the regenerative feedback circuit, wherein the input circuit is configured to receive true and complementary versions of the input data signal.

9. The apparatus of claim 1, wherein the latch includes a keeper circuit configured to maintain the latch node at a current logic value during the inactive phase of the clock signal.

10. A circuit comprising:
an input stage configured to, responsive to a clock signal transitioning to an active state, store true and complementary versions of a data input signal on first and second internal data nodes of a regenerative feedback circuit;
an output stage including:
a transfer circuit configured to provide, on a latch node, a first logic signal having a logic value that is based on a logic value of the data input signal and further configured to activate a portion of a discharge path during a precharge cycle;
a pre-driver circuit coupled to receive the data input signal and configured to discharge the latch node to a first logic value, via the portion of the discharge path, responsive to the clock signal transitioning to the active state and the data input signal being received at a second logic value; and
an output circuit coupled to the transfer circuit and configured to provide an output signal corresponding to the logic value of the data input signal.

11. The circuit of claim 10, wherein the output stage further includes a keeper circuit, wherein the keeper circuit includes a clocked inverter configured to store the first logic signal at a received logic value when the clock signal is inactive.

12. The circuit of claim 10, further comprising an input circuit coupled to the regenerative feedback circuit, wherein the input circuit includes a true data input and a complementary data input.

13. The circuit of claim 12, wherein the input circuit is configured to, when the clock signal is active, capture a logic value of the true data input on the first internal data node and capture a logic value of the complementary data input on the second internal data node.

14. The circuit of claim 10, further comprising first and second precharge circuits configured to precharge the first and second internal data nodes, respectively, when the clock signal is inactive.

15. The circuit of claim 10, wherein the input stage is configured to cause the transfer circuit to drive the latch node to the second logic value responsive to the clock signal transitioning to the active state and the data input signal being received at the first logic value.

16. The circuit of claim 10, further comprising an input circuit is configured to provide the first logic signal and a second logic signal to the transfer circuit at equivalent logic values, and further configured to provide the first logic signal prior to providing the second logic signal responsive to the clock signal transitioning to the active state and receiving the data input signal at a second logic value.

17. A non-transitory computer readable medium storing instructions that, when executed on a computer system, are usable to manufacture an electronic circuit, the electronic circuit comprising:
a differential amplifier circuit configured to:
during an active phase of a clock signal, generate a first amplifier output signal having an logic value equivalent to that of a input data signal;
store, during the active phase of the clock signal and using a regenerative feedback circuit, true and complementary values of the input data signal on true and complementary data nodes, respectively; and
precharge, during an inactive phase of the clock signal, the true and complementary data node to a precharged value;
a latch circuit including:
a transfer circuit coupled to the differential amplifier and configured to cause a latch node to be set at a logic value equivalent to the precharged value during the active phase of the clock signal in response to a current value of the first amplifier output signal having a first logic state and further configured to activate a discharge path in response to precharging the true data node; and
a pre-driver circuit coupled to receive the input data signal and configured to cause the latch node to be set, by discharging the latch node via the discharge path and responsive to the clock signal transitioning to the active phase, to a logic value complementary to the precharged value and the current value of the input data signal having a second logic state that is complementary to the first logic state.

18. The computer readable medium of claim 17, wherein:
the pre-driver circuit includes a first transistor coupled to the latch node and a second transistor coupled to the first transistor, wherein gate terminals of the first and second transistor are coupled to receive the clock signal and a true version of the input data signal, respectively; and
the transfer circuit is configured to, during the active phase of the clock signal set the latch node to one of the first or second logic states dependent on a current logic state of the first amplifier output signal.

19. The computer readable medium of claim 18, wherein the transfer circuit is further configured to inhibit a change of the latch node from a logic value equivalent to the precharged value to the logic value complementary to the precharged value in response to a second amplifier output signal being at the logic value complementary to the precharged value.

20. The circuit of claim 10, wherein the transfer circuit is configured to inhibit the latch node from being driven to the first logic value when the clock signal is in the active state and the data input signal is received at the first logic value.

* * * * *